US010903645B2

(12) United States Patent
Oms (10) Patent No.: US 10,903,645 B2
(45) Date of Patent: Jan. 26, 2021

(54) ELECTRICAL LINK COMPRISING AN ELECTRICAL PROTECTION SYSTEM

(71) Applicant: AIRBUS OPERATIONS (S.A.S.), Toulouse (FR)

(72) Inventor: Patrick Oms, Colomiers (FR)

(73) Assignee: AIRBUS OPERATIONS (SAS), Toulouse (FR)

( * ) Notice: Subject to any disclaimer, the term of this patent is extended or adjusted under 35 U.S.C. 154(b) by 310 days.

(21) Appl. No.: 16/133,545

(22) Filed: Sep. 17, 2018

(65) Prior Publication Data
US 2019/0089074 A1   Mar. 21, 2019

(30) Foreign Application Priority Data

Sep. 18, 2017   (FR) ...................................... 17 58600

(51) Int. Cl.
H02H 3/17   (2006.01)
H02H 7/20   (2006.01)
G01R 31/52  (2020.01)
G01R 31/00  (2006.01)
H02H 3/027  (2006.01)

(52) U.S. Cl.
CPC .............. H02H 3/17 (2013.01); G01R 31/52 (2020.01); H02H 7/20 (2013.01); *G01R 31/008* (2013.01); *H02H 3/027* (2013.01)

(58) Field of Classification Search
CPC ............ H02H 3/027; H02H 3/16; H02H 3/17; H02H 5/10; H02H 7/20; G01R 31/50; G01R 31/52; G01R 31/58; G01R 31/008
See application file for complete search history.

(56) References Cited

U.S. PATENT DOCUMENTS

| 5,101,161 A | 3/1992 | Walsh et al. |
| 2012/0256637 A1 | 10/2012 | Juhlin |
| 2013/0060970 A1* | 3/2013 | Cloury .................... G06F 1/263 710/14 |
| 2014/0104732 A1* | 4/2014 | Schult .................... H01H 83/02 361/42 |
| 2014/0104734 A1* | 4/2014 | Prisse .................... H02H 9/041 361/79 |

(Continued)

OTHER PUBLICATIONS

French Search Report cited in French Application No. 1758600 completed Jan. 30, 2018, one page.

*Primary Examiner* — Fred E Finch, III
(74) *Attorney, Agent, or Firm* — Nixon & Vanderhye P.C.

(57) ABSTRACT

An electrical link including a protective sheath surrounding at least two conductors each covered by an insulating jacket and an electrical protection system includes: a conductive sheath on each of the insulating jackets, a circuit breaker for each conductor; a direct current generator generating a direct current to be successively applied to each conductive sheath; and a leakage current detection circuit for each conductive sheath; a sequencer successively supplying the direct current to each conductive sheath; the detection circuit measures a current in each conductive sheath and compares a voltage proportional to the current to a first and second ranges of values, the detection circuit activating the circuit breaker if: the voltage is outside of the first range of values while the current generator generates a non-zero current; or the voltage is outside of the second range of values.

15 Claims, 8 Drawing Sheets

(56) References Cited

U.S. PATENT DOCUMENTS

| | | | |
|---|---|---|---|
| 2015/0346262 A1 | 12/2015 | Curtis | |
| 2016/0291073 A1* | 10/2016 | Handy | G01R 31/50 |
| 2017/0353027 A1* | 12/2017 | McTighe, Jr. | G08B 21/082 |
| 2018/0323602 A1* | 11/2018 | Oms | H02H 1/003 |
| 2018/0323603 A1* | 11/2018 | Flourens | G01R 31/50 |
| 2018/0358801 A1* | 12/2018 | Oms | B64D 45/00 |
| 2019/0097412 A1* | 3/2019 | Li | H02H 3/044 |
| 2019/0120889 A1* | 4/2019 | Carcia | G01R 31/52 |
| 2019/0148928 A1* | 5/2019 | Oms | H02H 3/093 |
| | | | 324/503 |

* cited by examiner

ELECTRICAL LINK COMPRISING AN ELECTRICAL PROTECTION SYSTEM

RELATED APPLICATION

This application claims priority to French Patent Application No. 1758600 filed Sep. 18, 2017, the entirety of which is incorporated by reference.

BACKGROUND OF INVENTION

The present invention relates to an electrical link comprising at least two electrical cables for the transmission of a high direct current voltage to user equipment item. The link includes an electrical protection system, such as a circuit breaker, for supplying the electrical energy safely.

An electrical installation of an aircraft comprises an electrical power source linked to user equipment items to be supplied with electrical energy via electrical cables insulated from one another and arranged in a protective sheath.

The amount of electrical power needed in an aircraft has been increasing. This trend leads inevitably to a rise in the voltage levels of the electrical power sources in the aircraft. Whereas electrical power sources previously provided aircraft with electrical power at 28 volts DC (DC for direct current), there is a demand now for electrical power at voltages on the order of 540 volts DC.

High voltage levels, such as at 540 volts DC, increase the need to provide protection from electrical leaks in the conductors enclosed in protective sheaths that are between a voltage source and user equipment items. Protection of the electrical links is needed to suppress parallel electrical arcs can occur in the event of a current leak in a link, such as from a protective sheath or between cables within the sheath. Such electrical arcs can arise due to degradation of the electrical insulation of the sheath and if there is a break in one of the conductors.

SUMMARY OF INVENTION

There is a need to safeguard against current leaks the supply of high voltage and direct current electrical energy to a user equipment item of an aircraft via electrical cables covered by a protective sheath.

The invention aims to address this need and relates to an electrical link comprising a protective sheath surrounding at least two conductors in which each conductor is suitable for linking a direct voltage source to a user equipment item and each conductor is surrounded by an insulating jacket. The electrical link also includes an electrical protection system. There is an electrical protection system is associated with each conductor and comprises:

a conductive sheath arranged around the insulating jacket of the conductor, a circuit breaker arranged on the conductor and configured, when activated, to open and interrupt electrical current through the conductor;

a direct current generator connected to the conductive sheath and configured to generate a non-zero current in response to an activation signal; and a leakage current detection assembly connected to the conductive sheath and to the circuit breaker;

a sequencer supplying, in succession, an activation signal to the current generators of the electrical link;

the leakage current detection assembly of a conductor is configured to measure a current passing through the conductive sheath and compare a voltage proportional to said current to a first range of values and to a second range of values, the leakage current detection assembly activating the circuit breaker:

(i) if the voltage is outside of the first range of values while the current generator generates a non-zero current; or (ii) if the voltage is outside of the second range of values while the current generator generates a zero current.

An electrical link according to the invention equipped with an electrical protection system makes it possible, on the occurrence of an abnormal leakage current on at least one of the two conductors indicating a loss of integrity of the protective sheath, to interrupt current in one or more of the conductors and thereby stop all or a part of the energy transmission.

The current interruption is rapid and occurs after a brief response time, such as a few milliseconds, of the electronic circuits. The rapid interruption of current avoids damage through thermal effect (electrical arcs) caused on the surrounding materials and the injection of current into the surrounding materials, as well as the propagation of the high voltage (HV) into the environment around the protective sheath.

SUMMARY OF FIGURES

The features of the invention mentioned above, and others, will become more clearly apparent on reading the following description of an exemplary embodiment, said description being given in relation to the attached drawings, in which.

DETAILED DESCRIPTION

Figure 1:
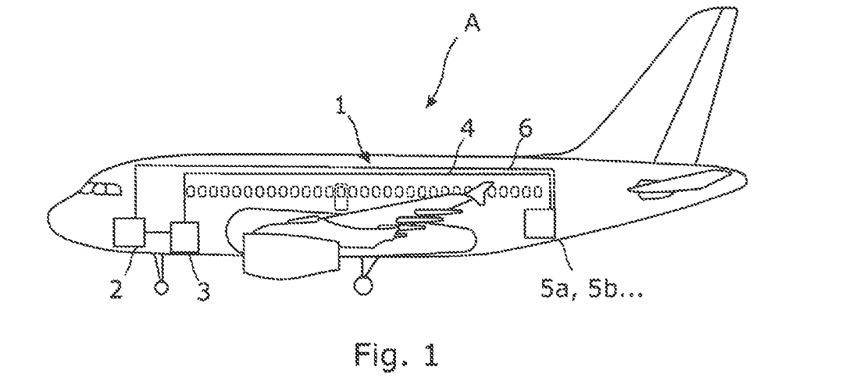
FIG. 1 illustrates an aircraft comprising an electrical installation having a power source connected to a plurality of user equipment items via an electrical link according to an embodiment of the invention.
Figure 2:
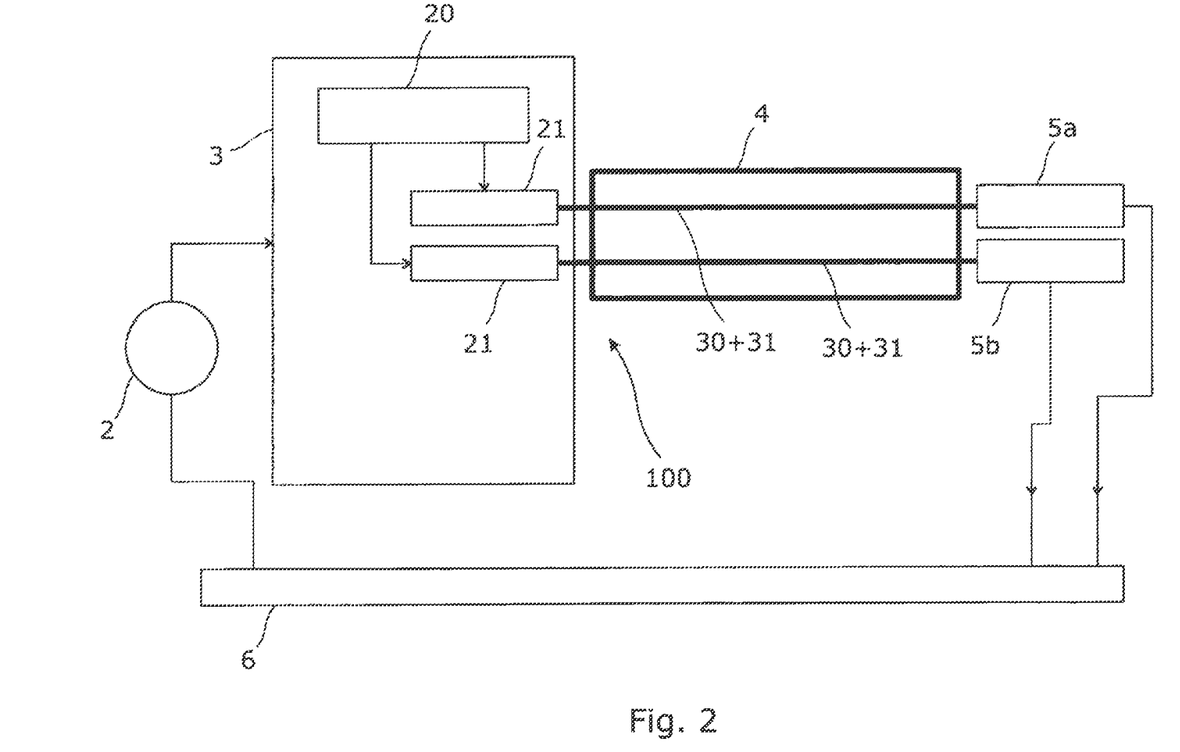
FIG. 2 is a block diagram of the electrical installation represented in FIG. 1, and a representation of an electrical protection system of the electrical link according to an embodiment of the invention, said link comprising a protective sheath and an electrical protection system.
Figure 3:
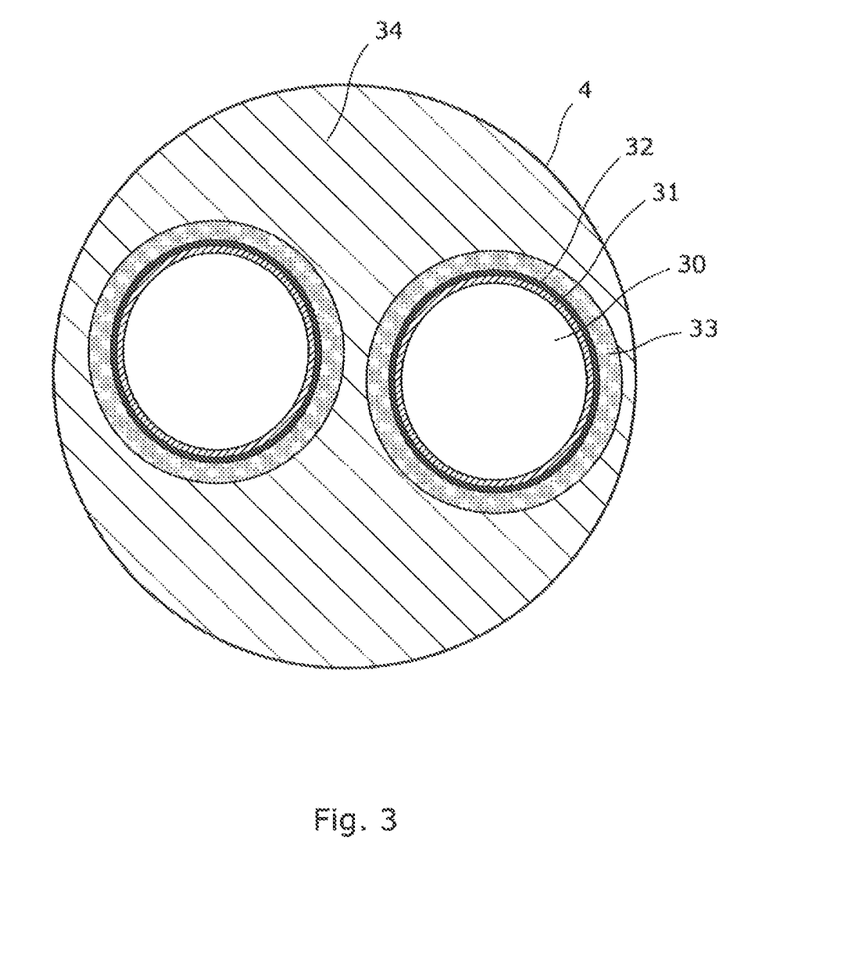
FIG. 3 is a cross-sectional view of the protective sheath of the electrical link represented in FIG. 2.

FIGS. 1 to 3 show an aircraft A that comprises an electrical installation 1 having a high voltage, direct current power source 2 supplying energy to at least two user equipment items 5a, 5b, in which each user equipment item is linked to the power source 2 via an electrical link 100. The high voltage, direct current power source 2 may supply electrical power at 540 voltages, or some other voltage level suited for supplying electrical power to the user equipment items 5a, 5b.

The electrical link 100 comprises a protective sheath 4 produced in an insulating material and at least two electrical conductors 30 arranged in the sheath, each conductor 30 linking the power source 2 to a user equipment item 5a, 5b.

To ensure the insulation between the conductors 30 of the protective sheath 4, each conductor 30 is jacketed by an insulating jacket 31 and the interior of the protective sheath 4 is also filled with an insulating material 34.

The power source 2 is also linked to the user equipment items 5a, 5b by a current return line 6. In the above description, current return line 6 should be understood to be either a return conductor or a current return network.

The high voltage power source 2 supplies direct current (DC) high voltages (HV) which can be two voltages of the same polarity, for example 2 times+540 V, or two voltages of a reverse polarity, for example + and −270 V.

Figure 4:
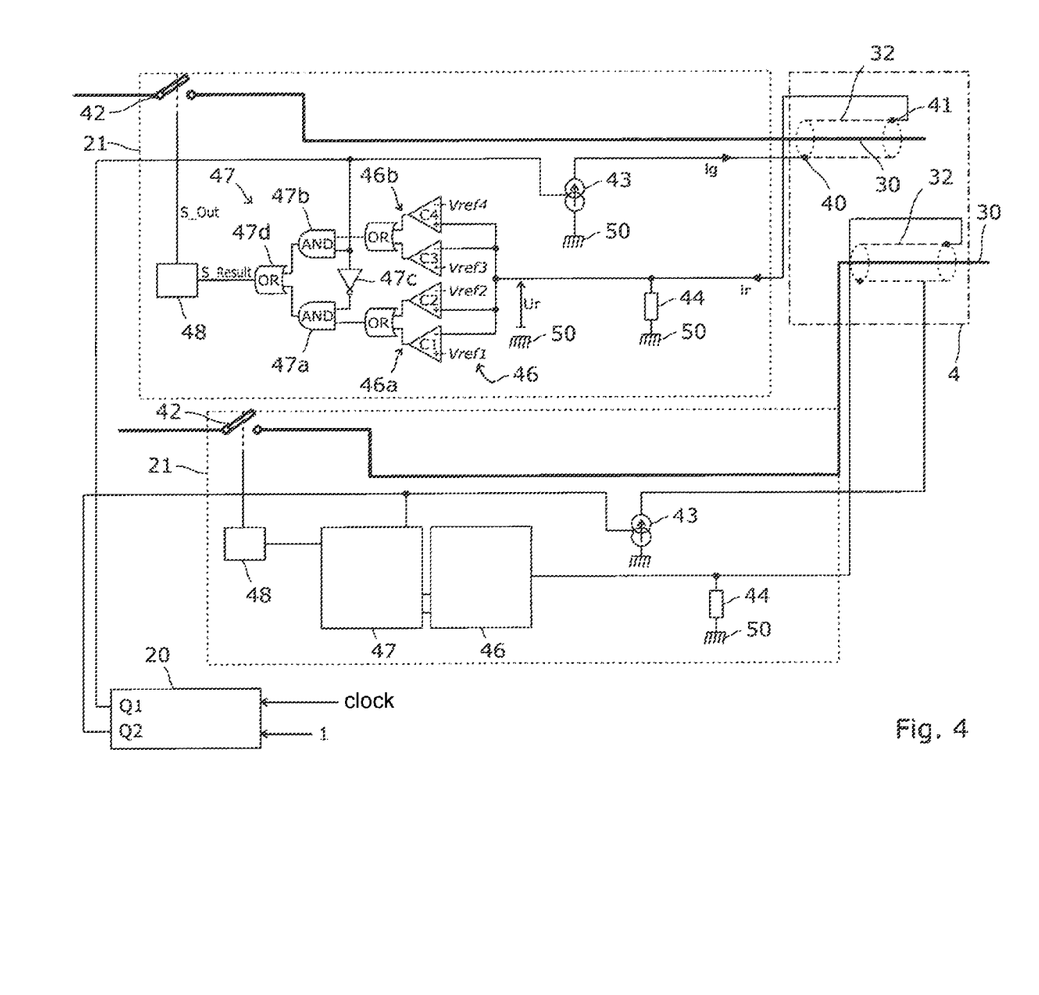
FIG. 4 is an electrical diagram of the electrical installation represented in FIG. 2.

The aircraft A also comprises a conductive structure (not represented) which is formed by any metallic-conductive element of the aircraft (for example: the frames, the runners, the subframe of the floor of the cabin) which is at the reference potential and forms the ground 50 (visible in FIG. 4).

According to the invention, the electrical link 100 comprises an electrical protection system 3 for securing the transmission of electrical energy from the power source 2 to the user equipment items 5a, 5b via the protective sheath 4.

Concerning FIGS. 2 and 3, the electrical protection system 3 comprises a sequencer 20 and, in the same way for each conductor 30 of the link:

(i) a conductive sheath 32 (for example of metal lattice type) surrounded by an insulating material 33, said conductive sheath 32 being arranged on the insulating jacket 31 of the conductor 30 and is directly in contact with said insulating jacket 31 (see FIG. 3); and (ii) an analysis and breaking device 21 arranged, for example, a housing/electronic circuit board, and which ensures the detection of leakage current to or from the conductive sheath 32 and the opening of the conductor 30 if a current leak is detected.

A current leak occurs in three cases:

(i) when the protective sheath 4 and the insulating material 34 are damaged and a conductive sheath 32 is in contact with the conductive structure of the aircraft A, (ii) when the insulating jacket 31 of one of the conductors 30 is damaged and an electrical arc or a contact occurs between the conductive sheath 32 and the conductor 30; and (iii) when the insulating material 34 is damaged and two conductive sheaths 32 are in contact.

Regarding FIG. 4, the sequencer 20, for example of microprogrammed type, receives a clock signal as input. The sequencer 20 has a plurality of channels Q1, Q2, called outputs, in which each output is associated with a single conductor 30 and is connected to the analysis and breaking device 21 dedicated to this conductor.

The sequencer 20 implements a predefined sequence consisting in activating, in succession, the outputs Q1, Q2, tractor-fashion, that is to say in sending, in succession, the activation signal to the outputs Q, Q2 (a single output receiving the activation signal at a given instant).

The successive activation of the outputs Q1, Q2 is paced by the clock of the sequencer. As an example, the clock frequency is 40 Hz, such that each output Q1, Q2 is activated for a time of 25 milliseconds.

The analysis and breaking device 21 dedicated to a conductor 30 comprises a circuit breaker 42, a direct current generator 43 and a leakage current detection assembly 49.

The circuit breaker 42 is arranged on the conductor 30 at the upstream end (power source side) of the conductor 30. As is known, the circuit breaker 42 functions as a switch which, when it receives an activation order, opens and thus powers down the conductor 30.

The direct current generator 43 is connected between the ground 50 and a current injection point 40 of the conductive sheath 32, said injection point being, for example, situated at the upstream end (power source side, downstream of the circuit breaker) of the conductor 30.

The current generator 43 is also connected to the output Q1, Q2 of the sequencer 20 dedicated to the conductor 30 such that its operation depends on the activation or non-activation of said output:

if the output is activated, the current generator 43 is activated and injects a non-zero bias current Ig at the current injection point 40, thus ensuring the bias of the conductive sheath 32; and if the output is deactivated, the current generator 43 does not product any current (Ig=0).

The detection assembly 49 comprises a current measurement resistor 44 of shunt type for measuring the current Ir passing through the conductive sheath 32 and, connected between the resistor 44 and the circuit breaker 42, a comparison module 46 followed by a multiplexer module 47 and then a confirmation module 48. The multiplexer module 47 may be an integrated circuit including logic functions for AND and OR. The comparison module may be an integrated circuit voltage comparator, such as a high-gain differential amplifier or an operational amplifier. The functions of the comparison 46 and multiplexer 47 and of the confirmation module 48 are, for example, implemented in a suitably programmed microcontroller.

The resistor 44, of known value Rshunt, is connected at a first terminal to a current sampling point 41 of the conductive sheath 32 and at a second terminal to the ground 50. The current sampling point 41 is situated, for example, at the downstream end (user equipment item side) of the conductor 30. As is known, the voltage (Ur) at the terminals of the resistor 44 is proportional to the current (Ir) passing through the resistor 44 and the conductive sheath 32, wherein Ur=Ir. Rshunt.

The comparison module 46 is connected to the first terminal of the shunt 44 via an electrical link 45, called detection line. The voltage in the detection line 45 is the voltage Ur proportional to the current Ir.

The comparison module 46 compares the voltage Ur in the detection line 45 to two ranges of voltage values, as follows:

a high range which is centred around an expected value of the voltage Ur in the detection line 45 when the current generator 43 is activated and the protective sheath 4 is not exhibiting any insulation fault problems. This expected voltage Ur value is called maximum voltage Urmax, and a low range which is centred around the zero voltage which corresponds to the voltage in the detection line 45 when no current is injected into the conductive sheath 32.

In absolute value, the minimum value of the high range is greater than the maximum value of the low range.

The detection assembly 49 is thus configured to measure the current Ir passing through the conductive sheath 32 by using the shunt resistor 44 and compare the value of the voltage Ur at the terminals of the shunt resistor 44, which is proportional to said current Ir, to the high range and to the low range.

In an exemplary embodiment illustrated in relation to FIG. 4, the comparison module 46 comprises two window comparators 46a, 46b, each window comparator comprising, as is known, two comparators C1, . . . , C4 and an OR logic gate receiving as input the output of the two comparators. In an example where Urmax is positive, the arrangement is as follows:

For the window comparator of the high range 46b:
(i) a first comparator C4 has its positive input terminal connected to the first terminal of the resistor 44 and its negative input terminal connected to a direct voltage generator (not represented) supplying a reference voltage Vref4 (highest voltage value of the high range);
(ii) a second comparator C3 has its negative input terminal connected to the first terminal of the resistor 44 and its positive input terminal connected to a direct voltage generator (not represented) supplying a reference voltage Vref3 (lowest voltage value of the high range); and
(iii) the OR logic gate receives as input the output of the two comparators C4, C3.

For the window comparator of the range of low values 46a:
(i) a first comparator C2 has its positive input terminal connected to the first terminal of the resistor 44 and its negative input terminal connected to a direct voltage generator (not represented) supplying a reference voltage Vref2 (highest voltage value of the low range);
(ii) a second comparator C1 has its negative input terminal connected to the first terminal of the resistor 44 and its positive input terminal connected to a direct voltage generator (not represented) supplying a reference voltage Vref1 (lowest voltage value of the low range); and
(iii) the OR logic gate receives as input the output of the two comparators C2, C1.

The choice of the reference voltages determines the maximum acceptable variation of Ur, therefore of Ir. The minimum and maximum values of the current Ir take account of the injected current Ig and of the normal and acceptable leakage currents which can exist in an electrical installation of an aircraft.

The multiplexer module 47 receives as input the output signals of the two window comparators 46a-b and is also connected to the output Q1, Q2 of the sequencer 20 associated with the conductor 30.

In an exemplary embodiment illustrated in relation to FIG. 4, the multiplexer module 47 comprises two AND logic gates, namely a first AND logic gate 47b receiving the output of the window comparator dedicated to the high range 46b and a second AND logic gate 47a receiving the output of the window comparator dedicated to the low range 46a.

The input of the first AND logic gate 47b is also connected directly to the output Q1, Q2 of the sequencer 20 associated with the conductor 30 whereas the input of the second AND logic gate 47a is connected to said output Q1, Q2 through a NOT logic gate 47c (which produces as output a signal set to 1 if its input is a signal set at 0, and vice-versa).

An OR logic gate 47d receives as input the outputs of the two AND logic gates 47a-b. The output signal S-Result of the OR logic gate is transmitted to the confirmation module 48.

The confirmation module 48 receives the output signal S_Result and counts down a time, called confirmation time tc, if the signal S_Result received is set at 1. If the signal S_Result remains at 1 for the entire duration of the confirmation time tc, then, at the end of the time tc, the confirmation module 48 sends an activation signal S_Out set at 1 to the circuit breaker 42.

The circuit breaker, on reception of the signal S_Out set at 1, opens the conductor 30.

The confirmation time tc is chosen to take account of the stabilization time of the electronics on each transition between Q1 and Q2, and the stabilization time of the current Ig. Thus, for an activation time of the channel of 25 milliseconds (40 Hz clock), a confirmation time tc of 5 milliseconds is a suitable value.

Examples of operation of the protection system according to the invention are illustrated in relation to FIGS. 5 to 8. These figures show, for an electrical installation 1, an example of trend of the signals Ig and Ir (FIGS. 5-6-7-8a), Ur (FIGS. 5-6-7-8b) and S_Result/S_Out (FIGS. 5-6-7-8c), when, from a time T1 and up to a time T2, the output of the sequencer associated with the electrical link is activated.

In these examples:
HV=540 V (the current in the conductor is 30 A)
Ig=1 A
Rshunt=10 ohms 10 watts
Vref4=15 V
Vref3=5 V
Vref2=2.5 V
Vref1=−2.5 V
Sequencer clock frequency: 40 Hz
tc=5 milliseconds
Urmax is substantially equal to 10 volts (to within the normal leakage currents)
Urmin is substantially equal to 0 volts (to within the normal leakage currents).

Figure 5A:
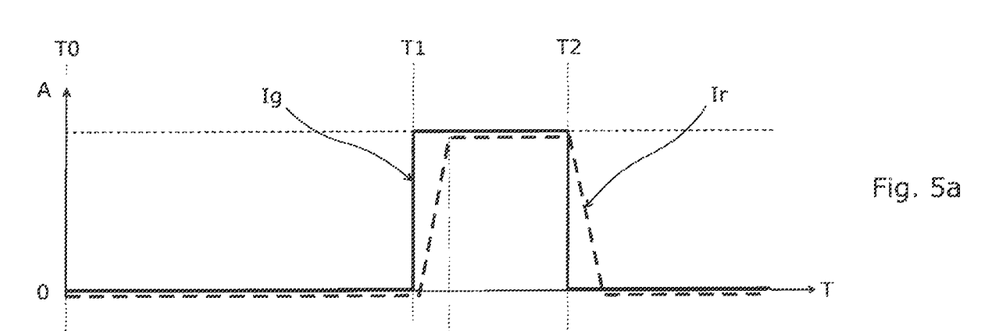
FIGS. 5a to 5c are diagrams illustrating the trend of the signals on the electrical installation represented in FIG. 2 when the protective sheath and its components have no faults.
Figure 5B:
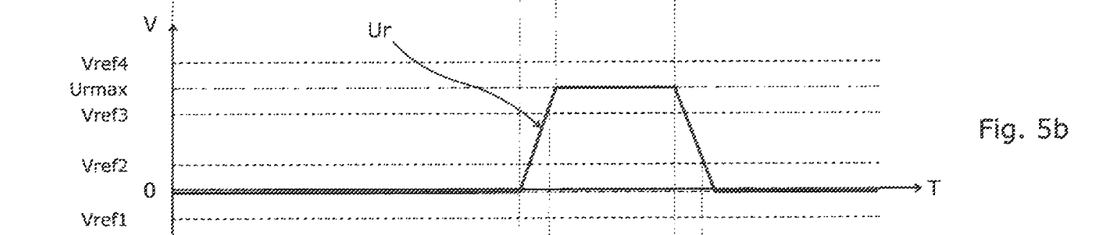
Figure 5C:
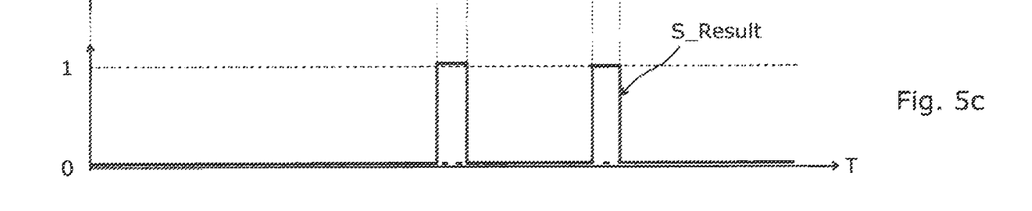

Concerning FIGS. 5a, 5b and 5c, a case is considered in which the protective sheath exhibits no faults.

From a time 0 to the time T1, the current generator 43 of the electrical link 10 is deactivated and the current Ig is equal to 0. Ir like Ur is therefore also substantially zero.

The window comparator 46a detects that Ur is within the low range and supplies an output signal set at 0.

The window comparator 46b, for its part, detects that Ur is outside of the high range and supplies an output signal set at 1.

The AND logic gate 47a associated with the window comparator 46a receives a signal set at 0 from the comparison module 46 and a signal set at 1 from the sequencer 20 (because of the NOT logic gate 47c). The signal from the gate 47a is therefore 0.

The AND logic gate 47b associated with the window comparator 46b receives a signal set at 1 from the comparison module 46 and a signal set at 0 from the sequencer 20. The signal from the gate 47b is therefore 0.

The confirmation module 48 receives a signal S_Result set at 0 from the multiplexer module 47 and the countdown of the confirmation time tc is not triggered.

From the time T1 and up to the time T2, the current generator 43 injects the current Ig into the conductive sheath 32 and the value of Ig immediately becomes equal to 1 A at the time T1. Between the times T1 and T2, the current Ir tends to reach a maximum value close to/but less than Ig, but not instantaneously because of the capacitive effects. Indeed, it takes a few milliseconds (of the order of 1 or 2 milliseconds) for the value of the current Ir to reach its maximum value.

The voltage Ur follows the curve of Ir and reaches its value Urmax after a few milliseconds.

During the delay of a few milliseconds, the window comparator 46b detects that the voltage Ur is outside of the high range and supplies an output signal set at 1.

The AND logic gate 47b receives the signal set at 1 from the comparison module 46 and a signal set at 1 from the sequencer 20.

The confirmation module 48 receives a signal S_Result set at 1 from the multiplexer module 47 and the countdown of the confirmation time tc starts. Now, the voltage Ur reaches its maximum value Urmax after a time less than the confirmation time tc so that the circuit breaker is not activated (the signal S_Out remains at 0).

From T2, the current generator 43 is deactivated and the value of the current Ig instantaneously becomes zero at the time T2. Ir tends to reach the zero value but not instantaneously because of capacitive effects. Indeed, it takes a few milliseconds (of the order of 1 or 2 milliseconds) for the value of the current Ir to become zero.

The voltage Ur follows the curve of Ir and also reaches its minimum value close to 0 (because of stray effects) after a few milliseconds.

During the delay of a few milliseconds, the window comparator 46a detects that the voltage Ur is outside of said range and supplies an output signal set at 1.

The AND logic gate 47a receives the signal set at 1 from the comparison module 46 and a signal set at 1 from the NOT logic gate 47c.

The confirmation module 48 therefore receives a signal S_Result set at 1 from the multiplexer module and the countdown of the confirmation time tc starts. Now, the voltage Ur reaches its minimum value close to 0 after a time less than the confirmation time tc so that the circuit breaker is not activated (the signal S_Out remains at 0).

The confirmation module 48 thus makes it possible to take account of the effects of stabilization of the current Ir on the injection/breaking of the current Ig.

Figure 6A:
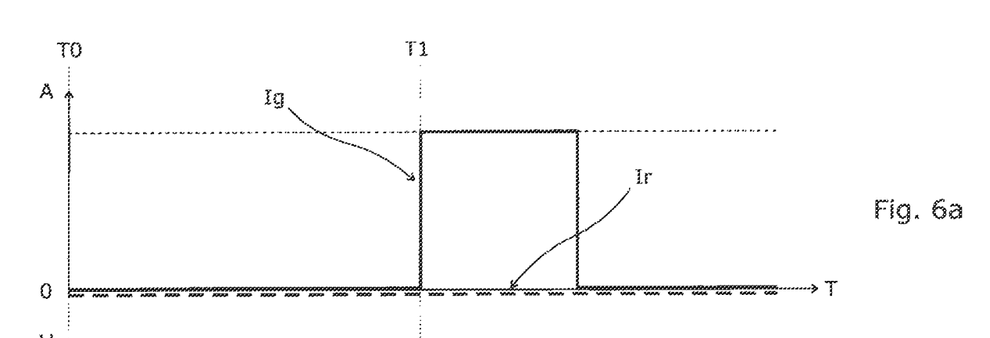
FIGS. 6a to 6c are diagrams illustrating the trend of the signals on the electrical installation represented in FIG. 2, when the protective sheath exhibits a first case of loss of integrity.
Figure 6B:
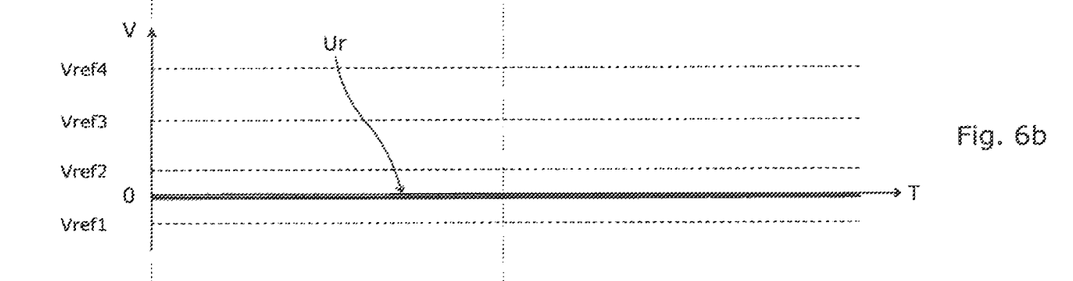
Figure 6C:
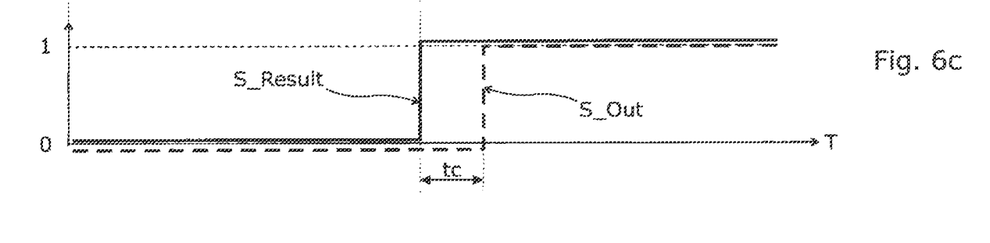

In the example of FIGS. 6a, 6b and 6c, a case is considered in which the protective sheath 4 and in which the insulating jacket 33 of the conductive sheath 32 of a conductor 30 are damaged so that the conductive sheath 32 is in contact with the structure of the aircraft (at the 0 V potential) from the time T0.

From the time T0 to the time T1, the current generator 43 is deactivated and the situation is identical to that which was described above in relation to FIG. 5 for the same period of time.

From the time T1, the current generator 43 injects the current Ig into the conductive sheath 32 which instantaneously takes the value of 1 ampere. Between the times T1 and T2, the current Ir has a value close to 0 because most of Ig flows into the structure of the aircraft because of the contact of the conductive sheath 32 with the structure. The voltage Ur consequently remains at a value close to 0 volt.

The window comparator 46b detects that the voltage Ur is outside of the high range and supplies an output signal set at 1.

The AND logic gate 47b receives the signal set at 1 from the comparison module 46 and a signal set at 1 from the sequencer 20.

The confirmation module 48 therefore receives a signal S_Result set at 1 from the multiplexer module and the countdown of the confirmation time tc starts. At the end of the confirmation time, the confirmation module 48 sends an activation signal S_Out set at 1 to the circuit breaker.

Figure 7A:
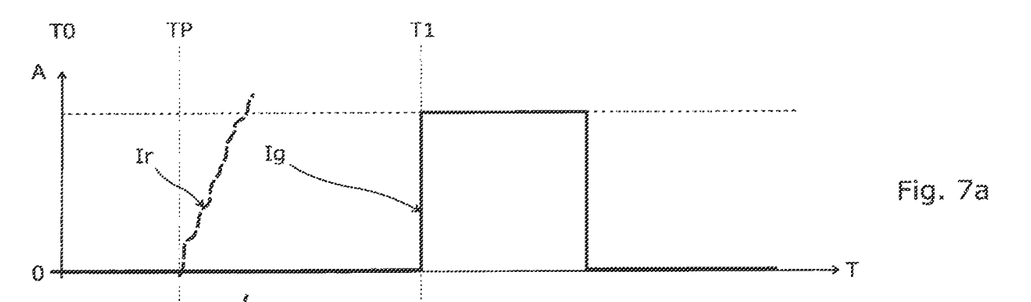
FIGS. 7a to 7c are diagrams illustrating the trend of the signals on the electrical installation represented in FIG. 2, when the protective sheath exhibits a second case of loss of integrity.
Figure 7B:
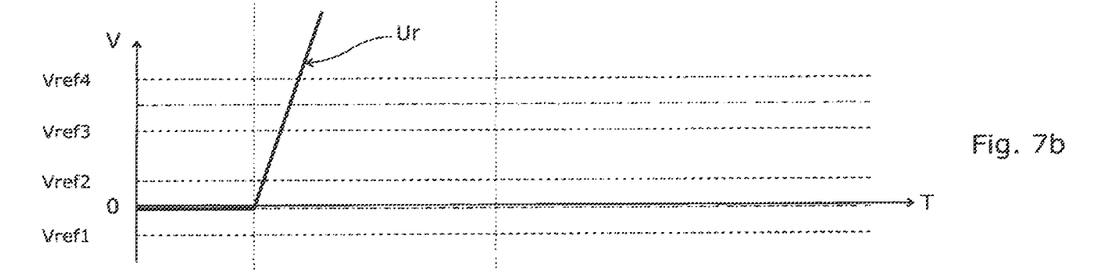
Figure 7C:
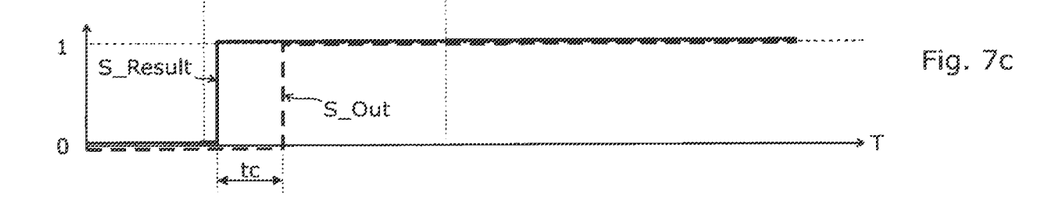

In the example of FIGS. 7a, 7b and 7c, a case is considered in which the insulating jacket 31 of one of the conductors 30 is damaged from a time Tp situated before the time T1, so that the conductive sheath 32 and the conductor 30 (or of another link) are in contact.

From the time T0 to the time Tp, the current generator 43 is deactivated and the value of the current Ig is zero. The confirmation module 48 receives a signal S_Result set at 0 from the multiplexer module 47.

From the time Tp, the current Ir follows an upwards slope linked to a current leak from the conductor 30, while the current generator 43 is deactivated and is not delivering current. The voltage Ur follows a same slope as the current Ir from the time Tp.

The window comparator 46a detects that Ur is outside of the low range and supplies a signal set at 1.

The AND logic gate 47a receives a signal set at 1 from the comparison module 46 and a signal set at 1 from the NOT logic gate 47c.

The confirmation module 48 receives a signal S_Result set at 1 from the multiplexer module 47 for a time greater than the confirmation time tc of the confirmation module and the confirmation module sends an activation signal S_Out set at 1 to the circuit breaker.

Figure 8A:
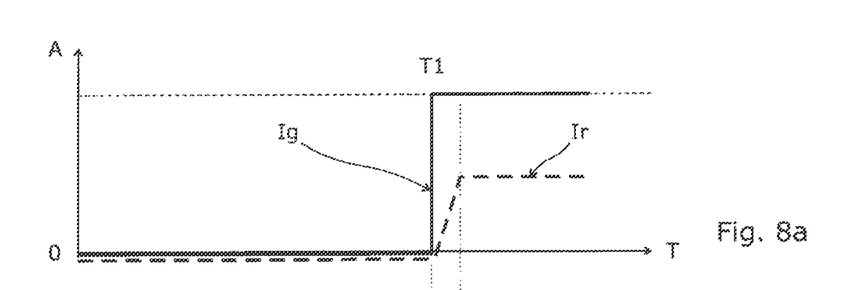
FIGS. 8a to 8c are diagrams illustrating the trend of the signals on the electrical installation represented in FIG. 2, when the protective sheath exhibits a third case of loss of integrity.
Figure 8B:
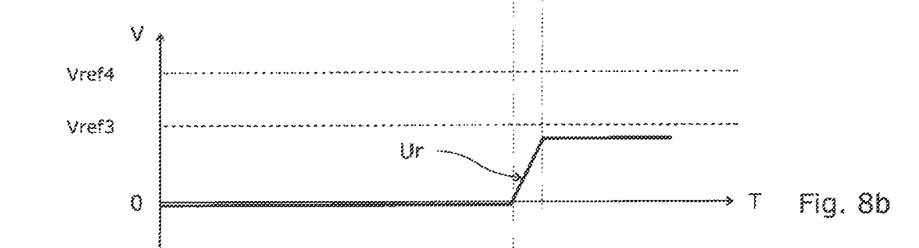
Figure 8C:
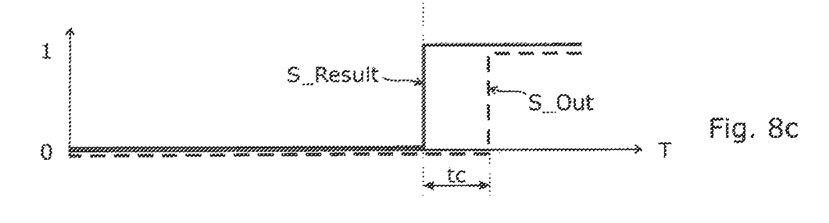

In the example of FIGS. 8a, 8b and 8c, a case is considered in which the insulation 34 under the protective sheath 4 is damaged, so that two conductive sheaths 32 are in contact from the time T0.

From the time T0 to the time T1, the current generator 43 is deactivated and the situation is identical to that which was described above in relation to FIG. 5 for the same period of time.

From the time T1, the current generator 43 injects the current Ig of 1 A which is distributed in the two conductive sheaths 32 because they are in contact. Between the times T1 and T2, the sum of the two currents Ir tends to reach a maximum value close to Ig, not instantaneously because of the capacitive effects.

The voltages Ur are stabilized after 1 or 2 ms at a value half the normal value because the two shunt resistors 44 are in parallel.

The window comparator 46b detects that the voltage Ur is outside of the high range and supplies an output signal set at 1.

The AND logic gate 47b receives the signal set at 1 from the comparison module 46 and a signal set at 1 from the sequencer 20.

The confirmation module 48 therefore receives a signal S_Result set at 1 from the multiplexer module 47 and the countdown of the confirmation time tc starts. At the end of the confirmation time, the confirmation module 48 sends an activation signal S_Out set at 1 to the circuit breaker.

An electrical link 100 according to the invention equipped with an electrical protection system 3 as described above makes it possible, on the occurrence of an abnormal leakage current on at least one of the two conductors indicating a loss of integrity of the protective sheath, to stop (via the breaking of one or more conductors) all or only a part of the energy transmission after a brief response time of the electronic circuits. The rapid breaking (a few milliseconds) of the electrical energy avoids damage through thermal effect (electrical arcs) caused on the surrounding materials and the injection of current into the surrounding materials, as well as the propagation of high voltage HV into the environment around the protective sheath.

In a variant not represented, the confirmation module 48 is connected to a display screen intended for a user and the confirmation module 48 sends a signal to display an alert on the display screen concurrently with the setting at 1 of the signal S_Out to activate the circuit breaker.

The current generator 43 is preferably limited in voltage with a limit that is chosen to be non-hazardous for physical people, typically less than 50 volts. This preferential option makes it possible to add a degree of additional protection for physical people.

In a variant that is not represented of the invention, the short-circuit devices 42 of the various current analysis and breaking devices 21 are connected to one another such that the activation of one circuit breaker 42 provokes the activation of all the other circuit breakers 42 in order to totally cut the transmission of electrical energy through the cable 4.

The invention has been described to protect the transmission of electrical energy via a cable of an electrical installation 1 of an aircraft A. However, the invention is applicable to any other type of vehicle, for example a ship or a motor vehicle.

The invention has been described, in particular via the example illustrated in FIG. 4, for a positive HV voltage. The modification of the invention to take account of other parameters (positive or negative HV voltage, positive or negative bias current Ig) is within the capability of the person skilled in the art.

The set ups described to perform the functions of the comparison module 46 and of the multiplexer module 47 are only exemplary embodiments of the invention. Other logic setups could be used to fulfil these functions without departing from the scope of the present invention.

In a variant of the invention not represented in the figures (the operation and the electrical diagrams of this variant are identical to what was described above in relation to FIGS. 1 to 8), the protective sheath of the electrical link is of loom type. In this case, the electrical conductors are of coaxial type and are routed together in said sheath.

Finally, other types of current sensors for measuring the current Ir passing through the conductive sheath 32 can be used instead of the resistor 44. These current sensors will be of technologies suited to the electrical characteristics of the electrical link 100.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention is:

1. An electrical link comprising:
a protective sheath surrounding conductors;
each of the conductors configured to link a direct voltage source to a respective user equipment item, wherein each of the conductors is covered by a respective insulating jacket;
an electrical protection system comprising:
a conductive sheath around the insulating jacket for each of the conductors,
for each of the conductors, a circuit breaker in series with the conductor and configured to interrupt current in the conductor when the circuit breaker is activated;
for each of the conductors, a direct current generator connectable to the conductive sheath and configured to apply a non-zero current (Ig) to the conductive sheath on reception of an activation signal; and
for each of the conductors, leakage current detection assembly connected to the conductive sheath and to the circuit breaker for the conductor;
a sequencer supplying, in succession, the activation signal to the current generators;
for each of the conductors, the leakage current detection assembly is configured to measure a current (Ir) passing through the conductive sheath and compare a voltage (Ur) proportional to said current (Ir) to a first range of values and to a second range of values, the detection assembly activating the circuit breaker:
if the voltage (Ur) is outside of the first range of values while the current generator generates a non-zero current (Ig); and
if the voltage (Ur) is outside of the second range of values while the current generator generates a zero current.

2. The electrical link according to claim 1, wherein a minimum value of the first range of values is greater than a maximum value of the second range of values.

3. The electrical link according to claim 1, wherein the sequencer comprises outputs (Q1, Q2) in which each of the outputs is dedicated to a respective one of the conductors, and is connected to the current generator and to the detection assembly associated with said conductor.

4. The electrical link according to claim 1, wherein each of the detection assemblies includes:
a resistor having a first terminal and a second terminal, the first terminal resistor being connected to the conductive sheath and the second terminal being connected to a ground at its second terminal; and
a comparison module connected to the first terminal of the resistor via an electrical link, and configured to compare the value of the voltage (Ur) to the first range of voltage values and to the second range of voltage values.

5. The electrical link according to claim 4, wherein the comparison module comprises a first window comparator for comparing the value of the voltage (Ur) to the first range of values and a second window comparator for comparing the value of the voltage (Ur) to the second range of values.

6. An electric protection system for a conductor in an electrical link in an aircraft, wherein the electrical link includes multiple conductors, and wherein the electric protection system includes:
a conductive sheath surrounding the conductor;
an insulating jacket surrounding the conductor and surrounded by the conductive sheath, wherein the insulating jacket isolates the conductive sheath from the conductor;
a circuit breaker in series with the conductor and configured to interrupt current in the conductor;
a direct current generator electrically connected to the conductive sheath and configured to generate a non-zero current in response to an activation signal;
a sequencer configured to cyclically and alternatively apply the non-zero current and a zero-voltage to the conductive sheath; and a leakage current detection circuit electrically connected to the conductive sheath and to the circuit breaker;

wherein the leakage current detection device is configured to measure a current (Ir) flowing through the conductive sheath and compare a voltage (Ur) proportional to the current (Ir) to a first range of voltage values and to a second range of voltage values, wherein the leakage detection assembly activates the circuit breaker to interrupt the current in the conductor:
if the voltage (Ur) is outside of the first range of voltage values while the current generator generates a non-zero current; and
if the voltage (Ur) is outside of the second range of voltage values while the current generator generates a zero current.

7. The electrical protective system of claim 6, wherein a minimum absolute value of the first range of voltage values is greater than a maximum value of the second range of voltage values.

8. The electrical protective system of claim 6, wherein the sequencer comprises outputs (Q1, Q2) in which each of the outputs connected to the current generator and to the leakage current detection circuit associated with said conductor.

9. The electrical protective system of claim 6, wherein the leakage current detection circuit includes:
a resistor having a first terminal connected to the conductive sheath and a second terminal connected to a ground; and
a comparator electrically connected to the first terminal of the resistor and configured to compare the value of the voltage (Ur) to the first range of voltage values and to the second range of voltage values.

10. The electrical protective system of claim 9, wherein the comparison module comprises a first window comparator for comparing the value of the voltage in the detection line to the first range of values and a second window comparator for comparing the value of the voltage in the detection line to the second range of values.

11. A method to electrically protect conductors in an electrical link in an aircraft, the method comprising:
providing electrical power from a power voltage in the aircraft through the electrical link to electrical powered devices in the aircraft, wherein a first device of the electrical powered devices receives the electrical power via a first conductor in the electrical link and a second device of the electrically powered devices receives the electrical power via a second conductor;
alternating between applying a zero value voltage and a non-zero direct current voltage to the first conductive sheath;
alternating between applying a zero value voltage and a non-zero direct current voltage to the second conductive sheath;
measuring electrical voltages of a first conductive sheath on the first conductor and monitoring electrical voltage levels of a second conductive sheath on the second conductor, wherein the first conductive sheath is electrically isolated from the first conductor by an insulating jacket sandwiched between the first conductive sheath and the first conductor, and the second conductive sheath is electrically isolated from the second conductor by an insulating jacket sandwiched between the second conductive sheath and the second conductor;
interrupting electrical current in the first conductor, if the measured electrical voltage of the first conductive sheath exceeds a low range of electrical voltage values while the zero value is applied to the first conductive sheath;
interrupting electrical current in the first conductor, if the measured electrical voltage of the first conductive sheath exceeds a high range of electrical voltage values while the non-zero direct current voltage is applied to the first conductive sheath, wherein the second range does not overlap with the first range;
interrupting electrical current in the second conductor, if the measured electrical voltage of the second conductive sheath exceeds the low range of electrical voltage values while the zero value is applied to the second conductive sheath;
interrupting electrical current in the second conductor, if the measured electrical voltage of the second conductive sheath exceeds the high range of electrical voltage values while the non-zero direct current voltage is applied to the second conductive sheath.

12. The method of claim 11 wherein the zero voltage is a voltage at a ground in the aircraft, and the measured electrical voltage is measured with respect to the ground.

13. The method of claim 11 wherein the non-zero direct current voltage is alternatively applied to the first and second conductors.

14. The method of claim 11 wherein the high range includes the non-zero direct voltage, and the low range includes the zero value.

15. The method of claim 11 wherein each of the interruption of the electrical current is delayed by a certain period after a transition between the zero value and the non-zero direct current and the determination of each of the interruptions is made after the certain period.

* * * * *